United States Patent
Suzuki et al.

(10) Patent No.: US 7,288,978 B2
(45) Date of Patent: Oct. 30, 2007

(54) DELAY CIRCUIT AND RING OSCILLATOR USING THE SAME

(75) Inventors: Hirohisa Suzuki, Gunma (JP); Kazuo Hasegawa, Gunma (JP); Eiji Akama, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 48 days.

(21) Appl. No.: 11/275,808

(22) Filed: Jan. 30, 2006

(65) Prior Publication Data

US 2006/0197572 A1   Sep. 7, 2006

(30) Foreign Application Priority Data

Feb. 2, 2005   (JP) .............................. 2005-026716

(51) Int. Cl.
*H03H 11/26* (2006.01)
(52) U.S. Cl. .................. 327/261; 327/264; 327/285
(58) Field of Classification Search ............... 327/261, 327/263, 264, 284, 285, 427, 437
See application file for complete search history.

(56) References Cited

U.S. PATENT DOCUMENTS

| | | | | |
|---|---|---|---|---|
| 5,081,380 A | * | 1/1992 | Chen | 327/262 |
| 5,568,103 A | * | 10/1996 | Nakashima et al. | 331/185 |
| 6,044,027 A | * | 3/2000 | Zheng et al. | 365/194 |
| 6,163,195 A | * | 12/2000 | Jefferson | 327/262 |
| 6,262,616 B1 | * | 7/2001 | Srinivasan et al. | 327/264 |
| 6,411,149 B1 | * | 6/2002 | Ooishi | 327/281 |
| 6,426,661 B1 | * | 7/2002 | Curran | 327/263 |
| 6,940,327 B2 | * | 9/2005 | Miki et al. | 327/172 |
| 6,992,534 B2 | * | 1/2006 | Lin | 331/176 |
| 7,230,467 B1 | * | 6/2007 | Gan et al. | 327/261 |

FOREIGN PATENT DOCUMENTS

| | | |
|---|---|---|
| JP | 8-186474 | 7/1996 |
| JP | 11-136295 | 5/1999 |

\* cited by examiner

*Primary Examiner*—Kenneth B. Wells
*Assistant Examiner*—Hai L. Nguyen
(74) *Attorney, Agent, or Firm*—Fish & Richardson P.C.

(57) ABSTRACT

In a delay circuit, when a first conductivity-type transistor (M6) becomes conductive on the basis of one level of its input signal, a first current path is formed through a source side transistor (M4), the first conductivity-type transistor (M6), and a second drive transistor (M9) between a source power line and a sink power line, and its output signal being the delayed inverse of the one level of the input signal is output from a connection point of another source side transistor (M5) and a sink side transistor (M11), and when a second conductivity-type transistor (M7) becomes conductive on the basis of the other level of the input signal, a second current path is formed through a first drive transistor (M3), the second conductivity-type transistor (M7), and another sink side transistor (M10), and the output signal being the delayed inverse of the other level of the input signal is output from the connection point.

9 Claims, 12 Drawing Sheets

--PRIOR ART--

--PRIOR ART--

DELAY CIRCUIT AND RING OSCILLATOR USING THE SAME

CROSS-REFERENCE TO RELATED APPLICATIONS

The present application claims priority from Japanese Patent Application No. 2005-26716 filed on Feb. 2, 2005, which is herein incorporated by reference.

BACKGROUND OF THE INVENTION

1. Field of the Invention

The present invention relates to a delay circuit and a ring oscillator using the same.

2. Description of the Related Art

In various applications, delay circuits that delay an input signal by a given time are used. In, for example, a MOST (Media Oriented Systems Transport) system that is a standard for vehicle-mounted networks, a digital signal to be transmitted and a clock signal are multiplexed (encoded) when transmitting the digital signal. The digital signal having the clock signal multiplexed therewith is transmitted to the destination apparatus, which extracts the original clock signal from the digital signal. In this extraction, a delay circuit is used.

FIG. 9 shows the configuration of a conventional clock extracting circuit for the differential-bi-phase-encoded digital signal (hereinafter called differential bi-phase code). (Refer to, for example, Japanese Patent Application Laid-Open Publication No. H11-136295.) FIG. 10 is a timing chart showing the operation of the conventional clock extracting circuit of FIG. 9.

First, the differential bi-phase code (see FIG. 10(b)) for digital data of a predetermined bit rate (see FIG. 10(a)) is transmitted to the conventional clock extracting circuit. An exclusive OR gate 16 performs an exclusive OR operation between the differential bi-phase code received and a delayed signal (see FIG. 10(c)) produced by a delay circuit 15 delaying the differential bi-phase code by a predetermined amount of time. The results of this operation are edge detection pulses (see FIG. 10(d)) indicating the rising edges and falling edges of the received differential bi-phase code being detected. An AND gate 17 performs an AND operation between the edge detection pulses and the output of a mono-multivibrator 18 (see FIG. 10(e)). The mono-multivibrator 18 generates a pulse of a predetermined width on the falling edge of a trigger signal (see FIG. 10(f)) that is the output of the AND gate 17.

The conventional clock extracting circuit performs the above series of operations and provides as a clock signal the output of the mono-multivibrator 18 based on the edge detection pulses from the received differential bi-phase code. In this way, the conventional clock extracting circuit uses delay circuits such as the delay circuit 15 and the mono-multivibrator 18 when extracting the clock signal.

Furthermore, for example, a ring oscillator circuit that generates an oscillation clock signal of a given frequency comprises inverter circuits that are delay circuits. FIG. 11 shows the configuration of a conventional ring oscillator circuit (refer to, for example, Japanese Patent Application Laid-Open Publication No. H08-186474).

The conventional ring oscillator circuit comprises a current control unit 20 and a ring oscillator unit 30.

In the current control unit 20, by a sum current (I1+I) of a current I1 from a constant current source and a control current i flowing through the drain of a transistor Q1, the sum current (I1+I) is copied into a transistor Q3. The current flowing through the transistor Q3 flows through a transistor Q2. The current flowing through the transistors Q2, Q3 is copied into drive transistors Q4a to Q4n and Q7a to Q7n to drive inverters 31a to 31n in the ring oscillator unit 30.

The ring oscillator unit 30 comprises the inverters 31a to 31n that have a delay time τ which are connected to be shaped like an n-stage ring. The inverters 31a to 31n have P-MOS transistors Q5a to Q5n and N-MOS transistors Q6a to Q6n respectively connected in series, and are supplied with a drive current i respectively via the drive transistors Q4a to Q4n on the source power (VCC) line side and the drive transistors Q7a to Q7n on the sink power (GND) line side. Pairs of the drive transistor Q4a to Q4n on the source power line side and the transistor Q2 each form a current mirror circuit, and pairs of the drive transistors Q7a to Q7n on the sink power line side and the transistor Q2 each form a current mirror circuit.

Where the drive currents i are flowing through the inverters 31a to 31n, when the input of the first stage inverter 31a is at a high (H) level, the last stage inverter 31n outputs a low (L) level with a delay time of n·τ. The output of the last stage inverter 31n is directly fed back to the input of the first stage inverter 31a. Hence, after another time of n·τ elapses, the output of the last stage inverter 31n becomes the H level. In this way, the output of the last stage inverter 31n repetitively takes on the H level/L level, generating an oscillation clock signal having an oscillation frequency f of 1/2n·τ.

With reference to FIG. 12, a usual voltage-current characteristic of a MOS transistor will be explained. As shown in FIG. 12, when the drain-to-source voltage VDS is low, the drain current ID linearly increases with the drain-to-source voltage VDS increasing, which is in a linear region. On the other hand, when the drain-to-source voltage VDS is high, the drain current ID is almost constant with the drain-to-source voltage VDS increasing, which is in a saturation region showing a constant-current characteristic.

As the operation range of a MOS transistor, the saturation region is mainly used where the drain current ID shows a constant-current characteristic. In the saturation region, the drain current ID increases with the gate-to-source voltage VGS increasing and decreases with the gate-to-source voltage VGS decreasing. In the saturation region, there is usually a relationship that the drain current ID is proportional to the gate-to-source voltage VGS squared as expressed by the equation (1):

$$ID = \beta/2(VGS-VT)^2, \quad (1)$$

where $\beta$ and VT are a gain and threshold voltage of the MOS transistor.

With reference to FIG. 13, a characteristic of a usual current mirror circuit will be explained.

FIG. 13(a) shows the configuration of the usual current mirror circuit, and FIG. 13(b) shows the characteristic thereof. In FIG. 13(b), the vertical axis represents a copied current I2 copied from a current I1 of a constant current source, and the horizontal axis represents power supply potential VCC. The characteristics shown in FIG. 13(b) indicate how the copied current I2 changes with varying the power supply potential VCC and varying the current I1 of the constant current source by steps of 10 µA from 10 µA to 100 µA. Comparing FIGS. 12 and 13, power supply potential VCC corresponds to the drain-to-source voltage VDS of a MOS transistor T1 and the copied current I2 corresponds to the drain current ID of the MOS transistor T1.

As shown in FIG. 13(a), in the current mirror circuit, as a result of the current I1 of the constant current source driving the MOS transistor T2, the drain-to-source voltage VDS of the MOS transistor T2 is applied as the gate-to-source voltage VGS of the MOS transistor T1. Since the gate electrodes of the MOS transistors T1, T2 are connected in common, their gate-to-source voltages VGS are equal. With this configuration, the current I1 flowing through the MOS transistor T2 is copied as the current I2 that flows through the MOS transistor T1.

As shown in FIG. 13(b), when power supply potential VCC is low, the copied current I2 is located in the linear region with not showing a constant-current characteristic. On the other hand, when power supply potential VCC is high, the copied current I2 is located in the saturation region with showing a constant-current characteristic. Since in the saturation region the drain currents ID of the MOS transistors T1, T2 are both proportional to the gate-to-source voltage VGS squared (see the equation (1)), the copied current I2 and the current I1 of the constant current source are in a linear relationship.

Therefore, to make the copied current I2 linearly follow the current I1 of the constant current source, the operation range of the MOS transistor T1 need be set to be in the saturation region by setting power supply potential VCC or the drain-to-source voltage VDS of the MOS transistor T1 high.

In the inverters 31a to 31n of FIG. 11, the drive transistors Q4a to Q4n and the drive transistors Q7a to Q7n forming part of the current mirror circuits are respectively connected to the source power line side and the sink power line side of the inverters 31a to 31n. That is, each of the inverters 31a to 31n is configured to be driven by the two current mirror circuits provided on the source power line side and the sink power line side. The ring oscillator unit 30 is configured to have sets of the four transistors (Q4, Q5, Q6, Q7) connected in series between the source power line side and the sink power line side.

Hence, if the drive current i is increased, enough drain-to-source voltage VDS may not be developed across the transistors (Q4, Q5, Q6, Q7). In this case, the transistors (Q4, Q5, Q6, Q7) go outside the constant current operation range and the drive current i does not linearly follow the control current (I1+I). The swing of the output voltages of the inverters 31a to 31n varies causing the delay time τ to vary.

As such, conventional delay circuits such as the inverters 31a to 31n shown in FIG. 11 are configured to be driven respectively by current sources provided on the source power line side and the sink power line side (current mirror circuits or the like). With this configuration, capability to linearly follow the control signal (current/voltage) cannot be obtained and accuracy in setting the delay time may be degraded.

SUMMARY OF THE INVENTION

According to a main aspect of the present invention to solve the above problem, there is provided a delay circuit which outputs an output signal produced by delaying an input signal according to a control signal for controlling a delay time. The delay circuit comprises an inverter that is formed in between a source power line and a sink power line by a first conductivity-type transistor (M6) on the source side and a second conductivity-type transistor (M7) on the sink side which complementarily become conductive according to a level of the input signal; a source side current mirror that is formed by two source side transistors (M4, M5) provided between the source power line and the inverter, wherein their control electrodes are connected in common and one of the source side transistors (M4) is connected to form a diode and in series to the first conductivity-type transistor (M6); a sink side current mirror that is formed by two sink side transistors (M10, M11) provided between the inverter and the sink power line, wherein their control electrodes are connected in common and one of the sink side transistors (M10) is connected to form a diode and in series to the second conductivity-type transistor (M7); a bias circuit that generates two bias signals to drive the first conductivity-type transistor (M6) and the second conductivity-type transistor (M7) respectively according to the control signal; a first drive transistor (M3) provided between the source power line and the second conductivity-type transistor (M7) that drives according to one of the bias signals; and a second drive transistor (M9) provided between the first conductivity-type transistor (M6) and the sink power line that drives according to the other of the bias signals. The other of the source side transistors (M5) and the other of the sink side transistors (M11) are connected in series. When the first conductivity-type transistor (M6) becomes conductive on the basis of one level of the input signal, a first current path is formed through the one of the source side transistors (M4), the first conductivity-type transistor (M6), and the second drive transistor (M9) between the source power line and the sink power line, and the output signal being the delayed inverse of the one level of the input signal is output from a connection point of the other of the source side transistors (M5) and the other of the sink side transistors (M11). When the second conductivity-type transistor (M7) becomes conductive on the basis of the other level of the input signal, a second current path is formed through the first drive transistor (M3), the second conductivity-type transistor (M7), and the one of the sink side transistors (M10) between the source power line and the sink power line, and the output signal being the delayed inverse of the other level of the input signal is output from the connection point of the other of the source side transistors (M5) and the other of the sink side transistors (M11).

According to the invention, there is provided a delay circuit having a simple mechanism to control a delay time so as to vary linearly according to a control signal, and a ring oscillator using the same.

Features and objects of the present invention other than the above will become apparent from the description of this specification and the accompanying drawings.

BRIEF DESCRIPTION OF THE DRAWINGS

For a more complete understanding of the present invention and the advantages thereof, reference is now made to the following description taken in conjunction with the accompanying drawings wherein.

DETAILED DESCRIPTION OF THE INVENTION

At least the following matters will be made clear by the explanation in the present specification and the description of the accompanying drawings.

<Delay Circuit>

==Configuration of Delay Circuit==

Figure 1:
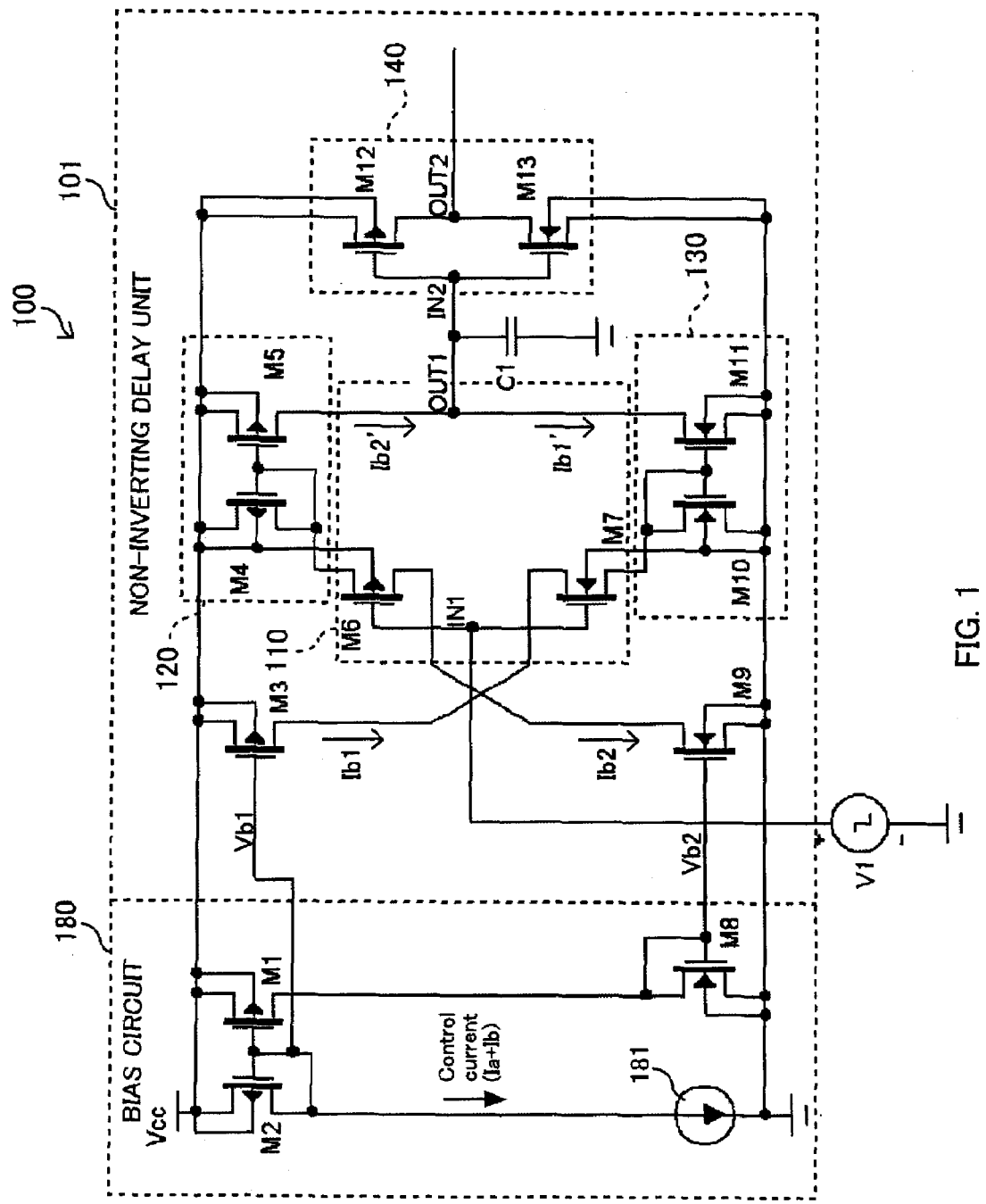
FIG. 1 is a diagram illustrating the configuration of a delay circuit according to an implementation of the present invention.

FIG. 1 is a diagram illustrating the configuration of a delay circuit 100 according to an implementation of the present invention. The delay circuit 100 is used, for example, in extracting a clock signal from an encoded digital signal received. The delay circuit 100 comprises a bias circuit 180 and a non-inverting delay unit 101.

First, the configuration of the bias circuit 180 will be described.

The bias circuit 180 generates two bias signals Vb1, Vb2 to drive the non-inverting delay unit 101 based on the current generated by a variable current source 181 (hereinafter called a "control current"). The bias circuit 180 is a current mirror circuit. These bias signals are supplied to drive-transistors M3, M9, and are signals to eventually set charging and discharging currents (Ib1', Ib2' in FIG. 2) for a capacitor C1 of the non-inverting delay unit 101.

In the configuration of the current mirror circuit as the bias circuit 180, two P-MOSFET transistors M1, M2 are provided in between the source power line (power supply potential Vcc) and the sink power line (ground potential GND), whose gate electrodes are connected to each other, and the gate and drain electrodes of the transistor M2 are short-circuited to form a diode. The variable current source 181 is provided between the drain electrode of the transistor M2 and the sink power line, and an N-MOSFET transistor M8 is provided between the drain electrode of the transistor M1 and the sink power line. The gate and drain electrodes of the transistor M8 are short-circuited to form a diode.

In this configuration, a current path for the control current (Ia+Ib) of the variable current source 181 is formed through the transistor M2 between the source power line and the sink power line. Also, a current path for a current copied from the control current of the variable current source 181 is formed through the transistors M1, M8 between the source power line and the sink power line. The gate voltages of the transistors M1, M2 are the bias signal Vb1 and the gate voltage of the transistor M8 is the bias signal Vb2.

For the connection of the bias circuit 180 and the non-inverting delay unit 101, for example, the gate electrode of the P-MOSFET transistor M3 is connected to the gate electrodes of the transistors M1, M2 of the bias circuit 180. As a result, the transistors M1, M2, M3 form a current mirror circuit. Meanwhile, the gate electrode of the N-MOSFET transistor M9 is connected to the gate electrode of the transistor M8 of the bias circuit 180. As a result, the transistors M8, M9 form a current mirror circuit.

Next, the configuration of the non-inverting delay unit 101 will be described.

The non-inverting delay unit 101 comprises an inverter 110, a source side current mirror 120, a sink side current mirror 130, the first drive transistor M3, the second drive transistor M9, the capacitor C1, and an inverter 140. If the delay circuit 100 is used as an inverting delay circuit, the inverter 140 is not needed.

The non-inverting delay unit 101 has a first conductivity-type transistor M6 on the source side and a second conductivity-type transistor M7 on the sink side provided in between the source power line and the sink power line, whose control electrodes are connected in common and a rectangular input voltage signal VIN1 having a swing level V1 is applied to the common connection. The first and second conductivity-type transistors M6, M7 complementarily become conductive according to the input voltage signal VIN1 switching in level.

In this implementation, the first conductivity-type transistor M6 is a P-MOS transistor and the second conductivity-type transistor M7 is an N-MOS transistor. Needless to say, not being limited to MOS transistors, the first and second conductivity-type transistors M6, M7 may be bipolar transistors.

The source side current mirror 120 consists of two source side transistors M4, M5 provided between the source power line and the inverter 110 and having their control electrodes connected in common. In the source side current mirror 120, the source side transistor M4 is connected to form a diode and in series to the first conductivity-type transistor M6.

In this implementation, the two source side transistors M4, M5 are P-MOS transistors. The source side transistor M4 has its gate and drain electrodes short-circuited to form a diode. The gate electrode is connected to the gate electrode of the other source side transistor M5, and the drain electrode is connected to the source electrode of the first conductivity-type transistor M6. Needless to say, the two source side transistors M4, M5 may be PNP-bipolar transistors, not being limited to P-MOS transistors.

The sink side current mirror 130 consists of two sink side transistors M10, M11 provided between the inverter 110 and the sink power line and having their control electrodes connected in common. In the sink side current mirror 130, the sink side transistor M10 is connected to form a diode and in series to the second conductivity-type transistor M7.

In this implementation, the two sink side transistors M10, M11 are N-MOS transistors. The sink side transistor M10 has its gate and drain electrodes short-circuited to form a diode. The gate electrode is connected to the gate electrode of the other sink side transistor M11, and the drain electrode is connected to the source electrode of the second conductivity-type transistor M7. Needless to say, the two source side transistors M10, M11 may be NPN-bipolar transistors, not being limited to N-MOS transistors.

The first drive transistor M3 is provided between the source power line and the second conductivity-type transistor M7 and driven by the bias signal Vb1 generated by the bias circuit 180. In this implementation, the first drive transistor M3 is a P-MOS transistor. The first drive transistor M3 has the bias signal Vb1 supplied to its gate electrode and is rendered conductive. A current Ib1 copied from the control current (Ia+Ib) via the current mirror operation by the transistors M1, M2 and the first drive transistor M3 flows through the first drive transistor M3. Needless to say, the first drive transistor M3 may be a PNP-bipolar transistor, not being limited to a P-MOS transistor.

The second drive transistor M9 is provided between the first conductivity-type transistor M6 and the sink power line and driven by the other bias signal Vb2 generated by the bias circuit 180. In this implementation, the second drive transistor M9 is an N-MOS transistor. The second drive transistor M9 has the bias signal Vb2 supplied to its gate electrode and is rendered conductive. A current Ib2 copied from the control current (Ia+Ib) via the current mirror operation by the transistor M8 and the second drive transistor M9 flows through the second drive transistor M9. Needless to say, the second drive transistor M9 may be an NPN-bipolar transistor, not being limited to an N-MOS transistor.

One electrode of the capacitor C1 is connected to an output terminal OUT1 at the connection point of the source side transistor M5 and the sink side transistor M11 and the other electrode is connected to the sink power line. The capacitor C1 has a capacitance corresponding to a given delay time. That is, a charge/discharge time depending on the capacitance of the capacitor C1 accounts for most of the delay time of the delay circuit 100. Note that the delay time of the delay circuit 100 depends on the control current (Ia+Ib) as well as the capacitance of the capacitor C1.

The inverter 140 has transistors M12, M13 of different conductivity types connected in series between the source power line and the sink power line. An input terminal IN2 of the inverter 140 is connected to the output terminal OUT1 and the one electrode of the capacitor C1. In this implementation, the transistor M12 is a P-MOS transistor and the transistor M13 is an N-MOS transistor.

With the configuration of the delay circuit 100, consider the case where on the basis of the L level of the input voltage signal VIN1, the first conductivity-type transistor M6 becomes conductive and the second conductivity-type transistor M7 non-conductive while the bias signal Vb1 is supplied to the gate electrode of the first drive transistor M3 and the bias signal Vb2 is supplied to the gate electrode of the second drive transistor M9. In this case, a first current path for the drive current Ib2 is formed through the source side transistors M4, the first conductivity-type transistor M6, and the second drive transistor M9 between the source power line and the sink power line.

Furthermore, in this case, in the source side current mirror 120, the drive current Ib2 is copied into the transistor M5 as its drain current. This copied current is called a current Ib2'. The current Ib2' is a charging current through the output terminal OUT1 to the capacitor C1. Thus, the charge-discharge waveform across the capacitor C1 becomes the delayed inverse in logic (the H level) of the input voltage signal VIN1. Since the charge-discharge waveform VOUT1 across the capacitor C1 becomes the H level, the transistor M12 is rendered non-conductive and the transistor M13 conductive. Through the output terminal OUT2 of the inverter, the output voltage signal VOUT2 being at the L level is output which coincides with that of the input voltage signal VIN1.

On the other hand, with the configuration of the delay circuit 100, consider the case where on the basis of the H level of the input voltage signal VIN1, the first conductivity-type transistor M6 becomes non-conductive and the second conductivity-type transistor M7 conductive while the bias signal Vb1 is supplied to the gate electrode of the first drive transistor M3 and the bias signal Vb2 is supplied to the gate electrode of the second drive transistor M9. In this case, a second current path for the drive current Ib1 is formed through the first drive transistor M3, the second conductivity-type transistor M7, and the sink side transistor M10 between the source power line and the sink power line.

Furthermore, in this case, in the sink side current mirror 130, the drive current Ib1 is copied into the transistor M11 as its drain current. This copied current is called a current Ib1'. The current Ib1' is a discharging current through the output terminal OUT1 from the capacitor C1. Thus, the charge-discharge waveform VOUT1 across the capacitor C1 becomes the delayed inverse in logic (the L level) of the input voltage signal VIN1. Since the charge-discharge waveform VOUT1 across the capacitor C1 becomes the L level, the transistor M12 is rendered conductive and the transistor M13 non-conductive. Through the output terminal OUT2 of the inverter, the output voltage signal VOUT2 being at the H level is output which coincides with that of the input voltage signal VIN1.

In this way, the delay circuit 100 delays the input voltage signal VIN1 supplied to the input terminal IN1 by the charge/discharge time depending on the levels of the bias signals Vb1, Vb2 and on the capacitance of the capacitor C1, and outputs the delayed input voltage signal VIN1 without inverting in logic through the output terminal OUT2.

==Configuration of Variable Current Source==

Figure 2:
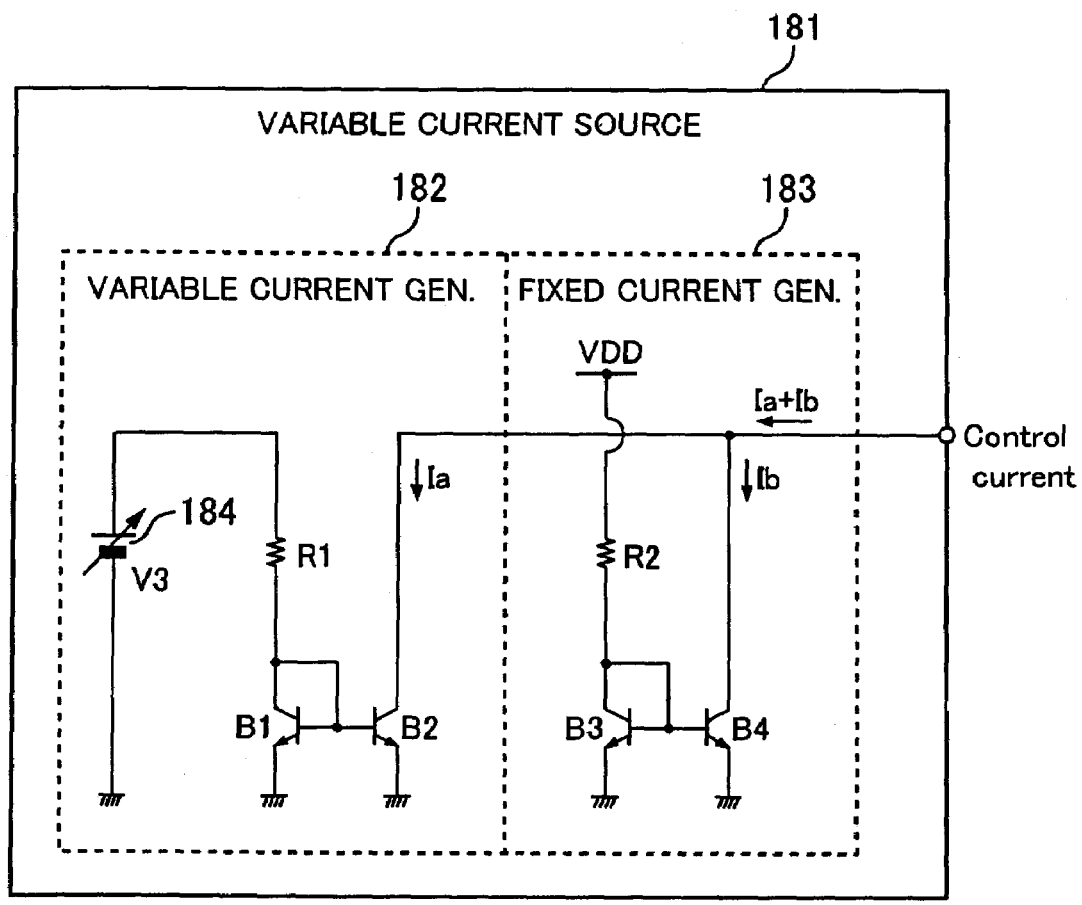
FIG. 2 is a diagram illustrating the configuration of a variable current source according to the implementation of the present invention.

FIG. 2 is a diagram illustrating the configuration of a variable current source 181 according to the implementation of the present invention.

The variable current source 181 comprises a variable current generator 182 and a fixed current generator 183.

The variable current generator 182 applies a variable voltage V3 of a variable voltage source 184 (hereinafter a control voltage V3) to a first resistor R1 thereby producing a variable current Ia. The variable current generator 182 has a current mirror circuit consisting of two NPN bipolar transistors B1, B2 where their base electrodes are connected to each other and the transistor B1 is connected to form a diode. The control voltage V3 from the variable voltage source 184 is applied to the collector electrode of the transistor B1 through the first resistor R1.

The fixed current generator 183 has the power supply potential VDD applied to a second resistor R2 thereby producing a fixed current Ib. The fixed current generator 183 has a current mirror circuit consisting of two NPN bipolar transistors B3, B4 where their base electrodes are connected to each other and the transistor B3 is connected to form a diode. The power supply potential VDD is applied to the collector electrode of the transistor B3 through the second resistor R2.

Furthermore, the collector electrodes of the transistor B2 of the variable current generator 182 and of the transistor B4 of the fixed current generator 183 are connected, and a current through the connection point becomes the control current (Ia+Ib). That is, the variable current source 181 outputs the combined current (Ia+Ib) of the variable current Ia produced by the variable current generator 182 and the fixed current Ib by the fixed current generator 183 as the control current.

==Charge-Discharge Waveform==

Figure 3:
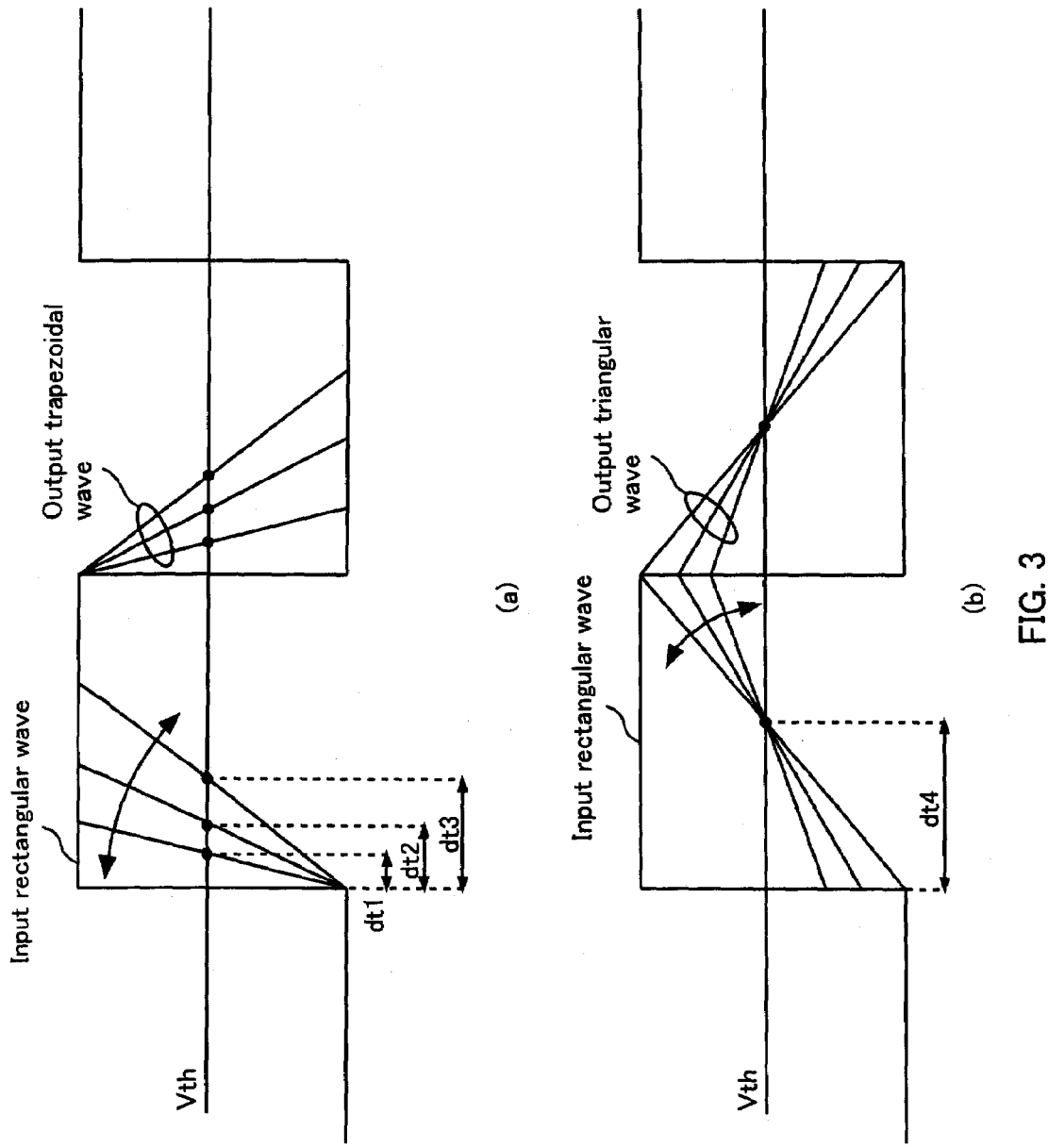
FIG. 3 shows schematically (a) a case where in response to an input rectangular wave, a trapezoidal charge-discharge waveform is produced and (b) a case where in response to an input rectangular wave, a triangular charge-discharge waveform is produced.

FIG. 3(a) shows schematically a case where in response to an input rectangular wave (the input voltage signal VIN1) inputted to the non-inverting delay unit 101, a trapezoidal charge-discharge waveform (hereinafter called an output trapezoidal wave) is obtained. In this case, the slope of the output trapezoidal wave is decided by the capacitance of the capacitor C1 and the levels of the bias signals Vb1, Vb2 from the bias circuit 180, i.e., the level of the control current (Ia+Ib) from the variable current source 181. As shown in FIG. 3(a), if the slope of the output trapezoidal wave varies, a time from the rising edge of the input rectangular wave until the level of the output trapezoidal wave reaches a predetermined threshold voltage Vth, i.e., a charge time (delay time) varies.

FIG. 3(b) shows schematically a case where in response to an input rectangular wave (the input voltage signal VIN1) inputted to the non-inverting delay unit 101, a triangular charge-discharge waveform (hereinafter called an output triangular wave) is obtained. In this case, the slope of the output triangular wave is also decided by the capacitance of the capacitor C1 and the control current (Ia+Ib) from the variable current source 181. However, as shown in FIG. 3(b), if the slope of the output triangular wave varies, a time from the rising edge of the input rectangular wave until the level of the output triangular wave reaches the predetermined threshold voltage Vth, i.e., a charge time (delay time) is almost constant. In the case of the output triangular wave, a dead band occurs where the charge time does not respond to variation in the level of the control current (Ia+Ib) from the variable current source 181.

Hence, not the triangular charge-discharge waveform but the trapezoidal charge-discharge waveform needs to be formed as the charge-discharge waveform across the capacitor C1. To form the trapezoidal charge-discharge waveform, the resistance ratio of the first resistor R1 of the variable current generator 182 to the second resistor R2 of the fixed current generator 183 and the capacitance of the capacitor C1 are set accordingly.

Figure 4:
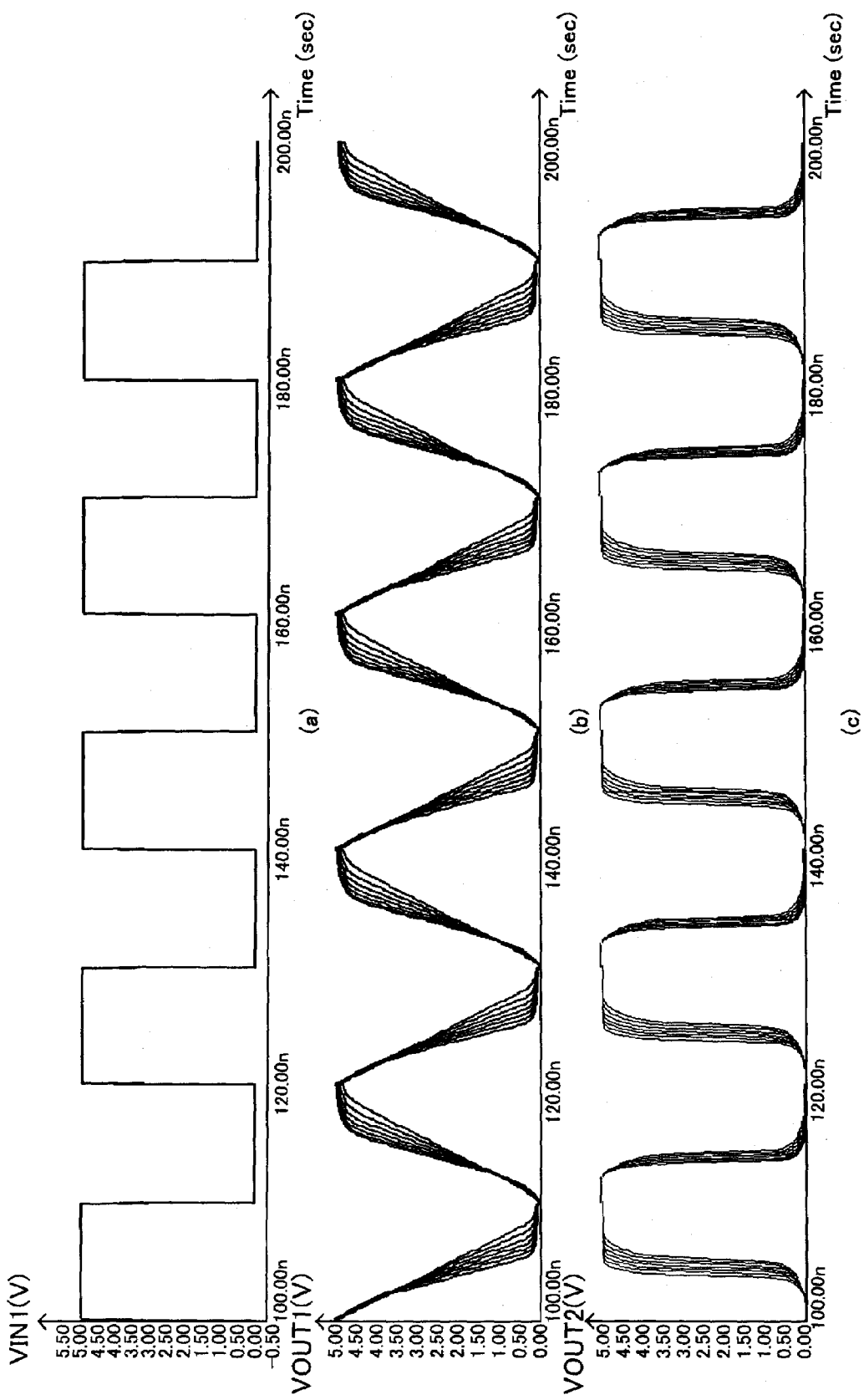
FIG. 4 shows (a) the simulation waveform of an input voltage signal VIN1, (b) the simulation waveform of an output voltage signal VOUT1, and (c) the simulation waveform of an output voltage signal VOUT2.

FIG. 4 shows simulation waveforms of main signals of the non-inverting delay unit 101. (a) of FIG. 4 shows the simulation waveform of the input voltage signal VIN1 input to the input terminal IN1 of the inverter 110; (b) of FIG. 4 shows the simulation waveform of the charge-discharge waveform VOUT1 across the capacitor C1, and (c) of FIG. 4 shows the simulation waveform of the output voltage signal VOUT2 output from the output terminal OUT2 of the inverter 140.

For example, in response to falls of the input voltage signal VIN1 (see (a) of FIG. 4), the charge-discharge waveform VOUT1 across the capacitor C1 (see (b) of FIG. 4) ascends at a gradient depending on the level of the control current (Ia+Ib) and the capacitance of the capacitor C1, while the capacitor C1 is charged. Since the capacitance of the capacitor C1 is predetermined, by varying the level of the control current (Ia+Ib), the gradient of the charge-discharge waveform VOUT1 across the capacitor C1 is variable. The range in which the control current (Ia+Ib) is variable is set such that the charge-discharge waveform across the capacitor C1 becomes trapezoidal and thus a dead band does not exist for the variation in the control current (Ia+Ib).

Next, when the charge-discharge waveform VOUT1 across the capacitor C1 (see (b) of FIG. 4) ascends and the level thereof reaches threshold voltages Vth of the transistors M12, M13 of the inverter 140, the output voltage signal VOUT2 starts falling (see (c) of FIG. 4). The non-inverting delay unit 101 delays the input voltage signal VIN1 by a time from a fall of the input voltage signal VIN1 until the level of the charge-discharge waveform VOUT1 across the capacitor C1 reaches the threshold voltage Vth of the inverter 140.

Here, examining the charge-discharge waveform VOUT1 and the output voltage signal VOUT2 (see (b), (c) of FIG. 4), it is found that the delay time of the output voltage signal VOUT2 with respect to a rise/fall edge of the input voltage signal VIN1 varies according to the variation in level of the control current (Ia+Ib) as long as the charge-discharge waveform VOUT1 is trapezoidal.

<Example of Effects>

Figure 11:
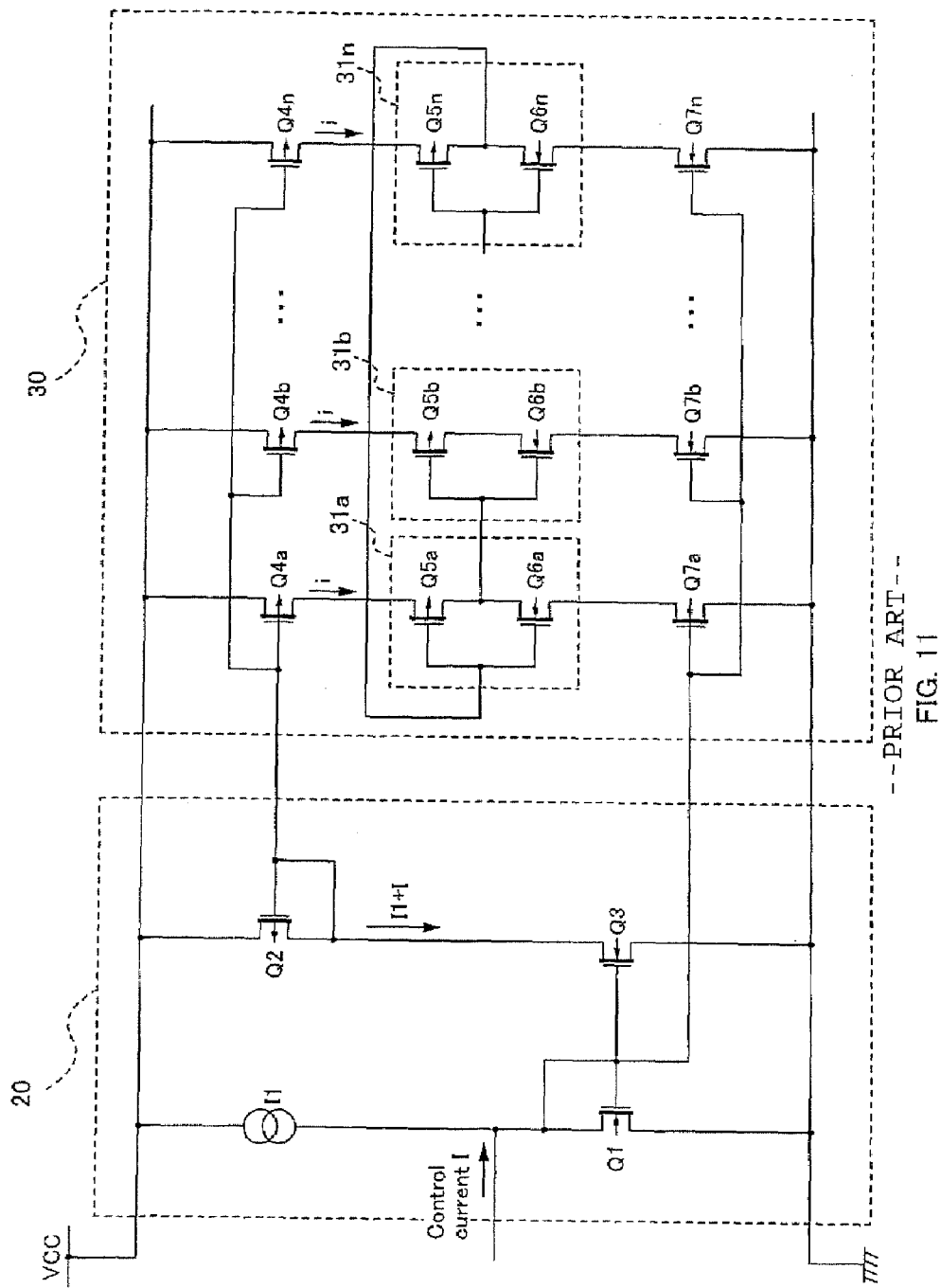
FIG. 11 is a diagram illustrating the configuration of a conventional ring oscillator.

In the configuration of the conventional delay circuit as shown in FIG. 11, the four transistors (Q4, Q5, Q6, Q7) are connected in series between the source power line side and the sink power line side. And in the inverters 31a to 31n, because the P-MOS transistors Q5a to Q5n and the N-MOS transistors Q6a to Q6n complementarily become conductive, a current path from the source power line to the sink power line does not occur. Moreover, since in the inverters 31a to 31n the drive current i is controlled by both the P-MOS transistor Q5a to Q5n and the N-MOS transistor Q6a to Q6n, the swing level of the output signal is likely to be unstable.

Furthermore, with the configuration of the conventional delay circuit as shown in FIG. 11, it is known that, where the inverters 31a to 31n need be made to operate at a low voltage, the P-MOS transistors Q5a to Q5n and the N-MOS transistors Q6a to Q6n need to have a longer gate width to extend the current control range (saturation region). If the gate width is elongated, the gate capacitance becomes larger with the gate length being constant. Hence, if the delay time needs to be set short, the gate capacitance greatly affects the setting of the delay time. Thus, it is not allowed to connect capacitors to the outputs of the P-MOS transistors Q5a to Q5n and the N-MOS transistors Q6a to Q6n. Also, the gate capacitance varies depending on the drain current and the like, thus being hardly treated as a constant.

In contrast, in the delay circuit 100 according to the present invention, a current path is formed through three transistors between the source power line side and the sink power line side. For example, either the first current path for the drive current Ib2 through the source side transistors M4, the first conductivity-type transistor M6, and the second drive transistor M9 or the second current path for the drive current Ib1 through the first drive transistor M3, the second conductivity-type transistor M7, and the sink side transistor M10 is formed between the source power line and the sink power line.

Figure 12:
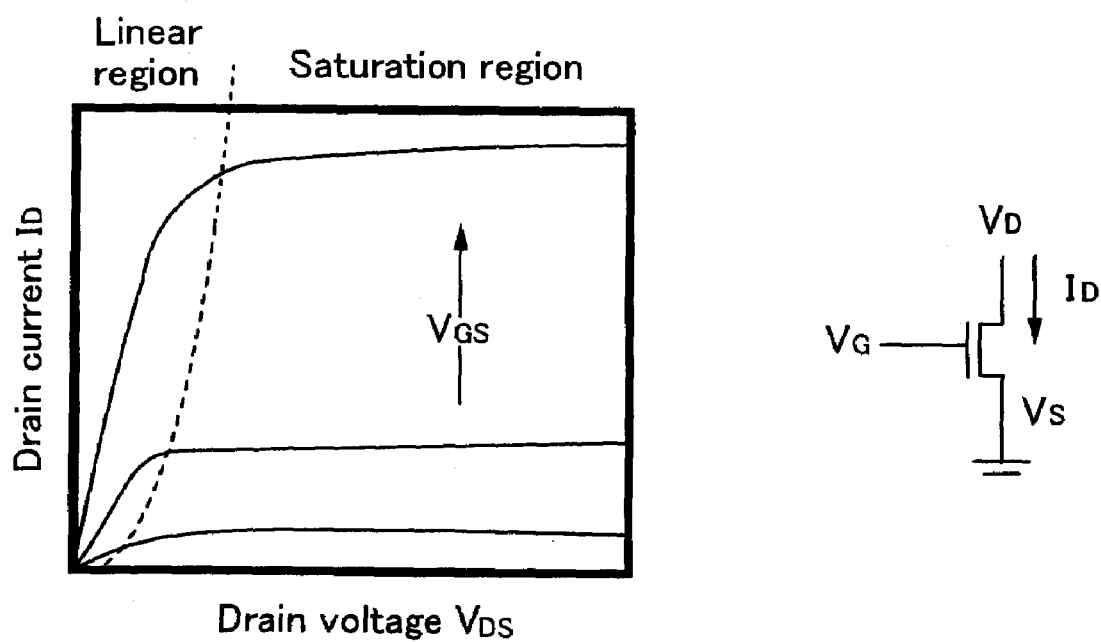
FIG. 12 shows a usual voltage-current characteristic of a MOS transistor.
Figure 13:
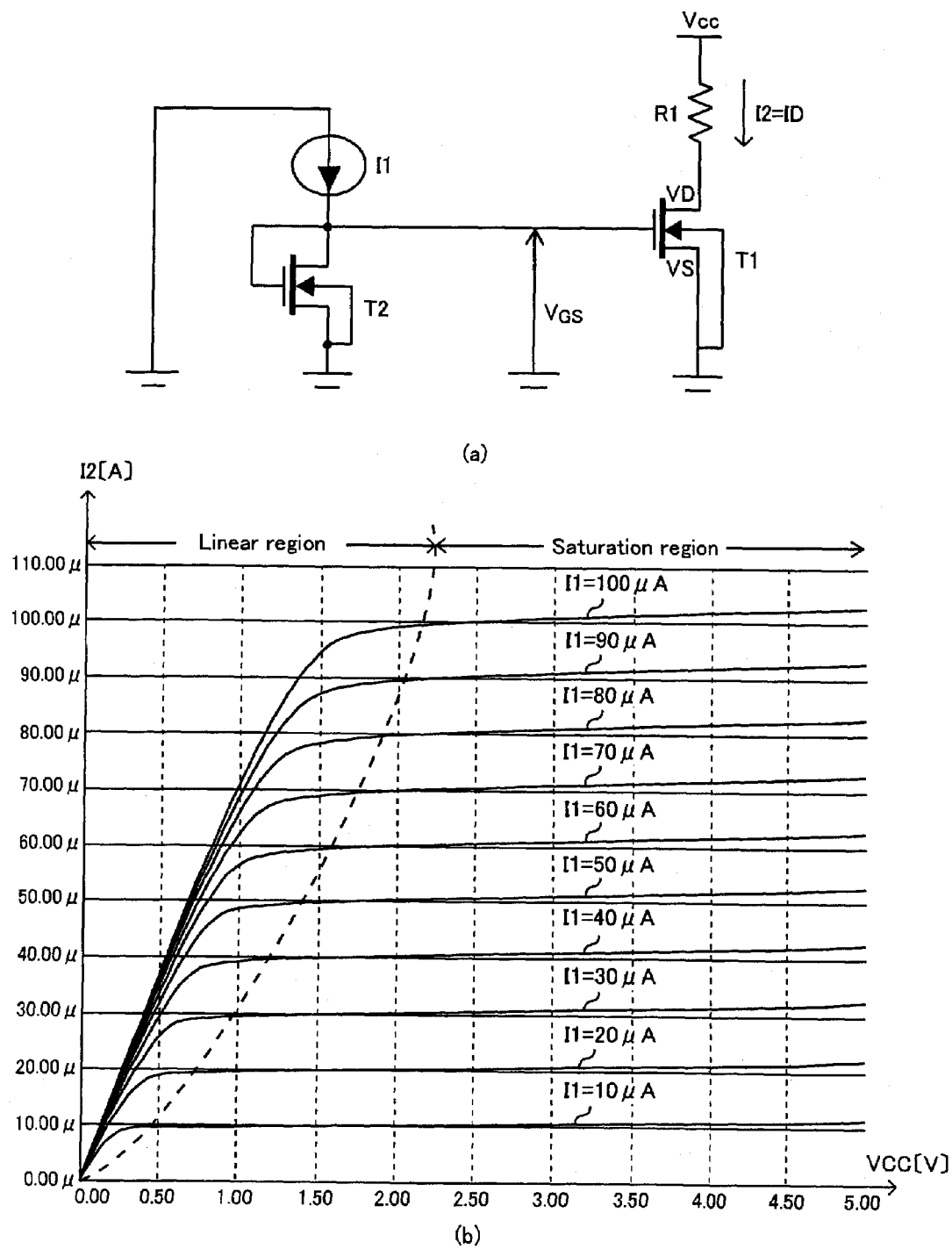
FIG. 13 shows (a) the configuration of a usual current mirror circuit and (b) a characteristic of the usual current mirror circuit.

In the delay circuit 100 of the present invention, compared with the conventional delay circuit, enough voltage (drain-to-source voltage VDS) is applied to the three transistors (M4, M6, M9 or M3, M7, M10), while the drive currents Ib1 and Ib2 are increased. Therefore, in the delay circuit 100 of the invention, the current control range (saturation region) is extended for the transistors to operate only in the saturation region shown in (b) of FIG. 12. As a result, the delay time can be controlled linearly according to the control signal, the control current (Ia+Ib) or the control voltage V3.

Moreover, in the delay circuit 100 of the invention, the swing levels of the charge-discharge waveform VOUT1 and of the output voltage signal VOUT2 can be set almost equal to the potential difference between the source power potential (Vcc) and the sink power potential (GND). As a result, the charge-discharge waveform VOUT1 can be input directly to the input of the inverter 140. Furthermore, the output voltage signal VOUT2 can be input directly to the subsequent stage circuit to the delay circuit 100 not via capacitor coupling.

Furthermore, with the delay circuit 100 of the invention, compared with the conventional delay circuit, the current control range can be extended beforehand. Hence, if the delay time needs to be set shorter, the gate capacitance need not be made smaller. Thus, the capacitor C1 having a capacitance corresponding to the delay time can be connected to the output terminal OUT1 at the connection point of the source side transistor M5 and the sink side transistor M11. That is, without taking into account the effect of the gate capacitance, the delay time can be set highly accurately using the capacitor C1.

Yet further, in the delay circuit 100 of the invention, the control of the delay time is performed by controlling the level of the variable current Ia generated by the variable current generator 182. The variable current source 181 has the fixed current generator 183 separate from the variable current generator 182. Thus, even if the variable current Ia is near zero upon power-on or the like, of the control current (Ia+Ib) of the variable current source 181, the fixed current Ib generated by the fixed current generator 183 flows constantly, and thus the bias circuit 180 operates stably.

Still further, in the delay circuit 100 of the invention, the variable current generator 182 and the fixed current generator 183 each have a current mirror circuit consisting of two bipolar transistors. Bipolar transistors develop a stable voltage drop of Vbe when conductive. Hence, the levels of the variable current Ia and the fixed current Ib are stabilized compared with the case where the variable current generator 182 and the fixed current generator 183 each have a current mirror circuit consisting of two MOS transistors.

<Ring Oscillator>

Figure 5:
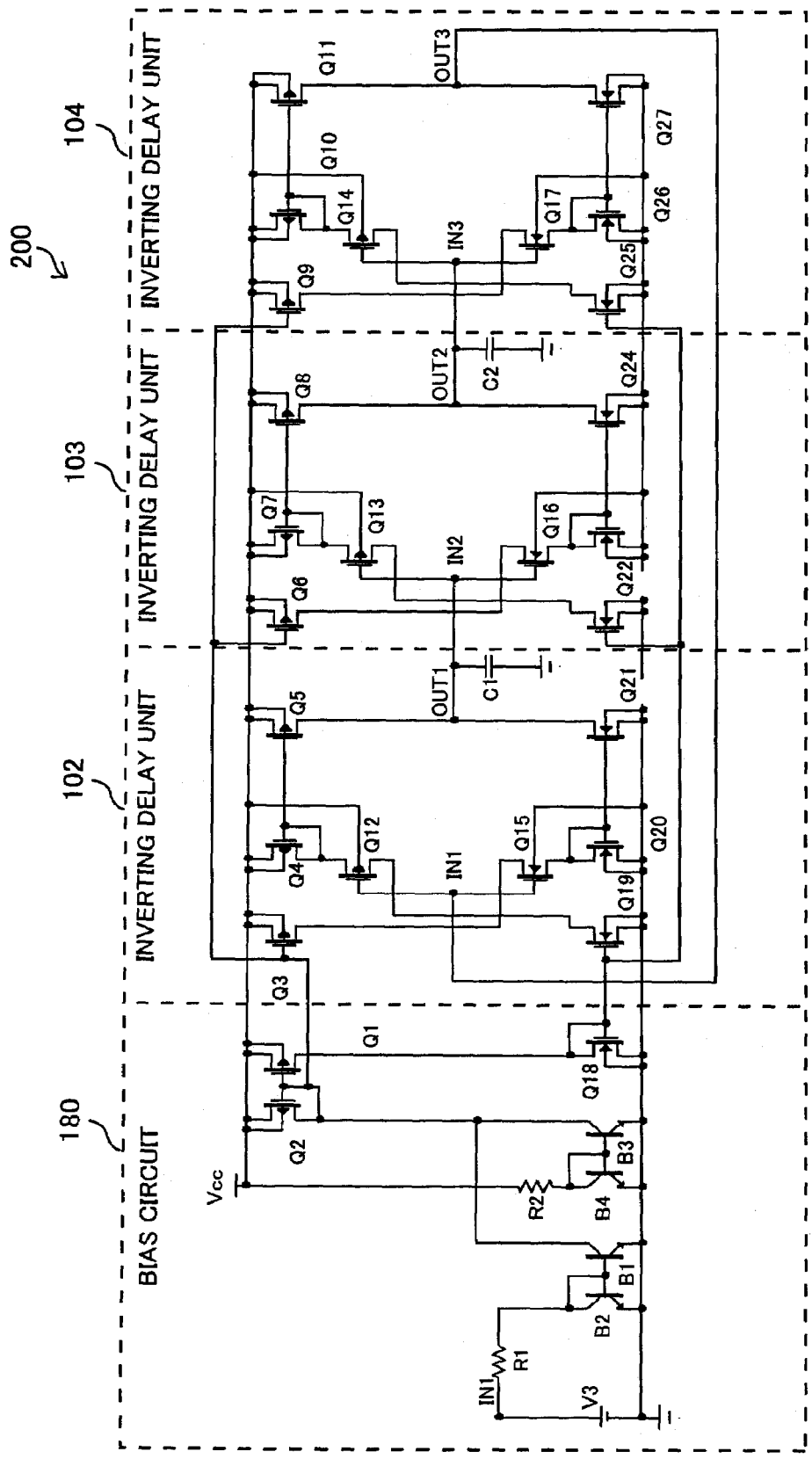
FIG. 5 is a diagram illustrating the configuration of a ring oscillator according to the implementation of the present invention.

FIG. 5 shows the configuration of a ring oscillator 200 according to the implementation of the present invention.

The ring oscillator 200 has three inverting delay units 102, 103, 104 having the same configuration as the non-inverting delay unit 101 of FIG. 1 except that the last stage inverter 140 is removed, which are connected to be shaped like a ring.

In the ring oscillator 200, at least one of three capacitors respectively provided in the three inverting delay units 102, 103, 104 is eliminated by combining its capacitance into the capacitances of the others. The maximum capacitance of the capacitors subject to the combination needs to be limited to within such a range that a trapezoidal charge-discharge waveform is developed. For example, if the three capacitors provided in the three inverting delay units 102, 103, 104 are 1 pF each, the capacitor of the inverting delay unit 104 at the last stage can be eliminated by setting the capacitor C1 of the inverting delay unit 102 at 1.5 pF and the capacitor C2 of the inverting delay unit 103 at 1.5 pF.

As such, whether capacitors are distributed to the three of the inverting delay units 102, 103, 104 or any two of them or are combined and put in one of them, the same delay time is obtained unlike with the conventional art. This is because as to the inverting delay units 102, 103, 104, the delay time can be controlled linearly according to the control signal unlike with the conventional art and thus the capacitance of the capacitor and the delay time are held in a proportional relationship in any case.

In order to shorten the delay time, the inverting delay units 102, 103, 104 need a capacitor of low capacitance. It is known that the capacitor of low capacitance is usually affected by parasitic capacitance at its terminals and periphery thus increasing error in capacitance. Therefore, in the present invention, by combining the capacitance of at least one capacitor into the capacitances of the others, the above problem of error in capacitance can be avoided. Furthermore, spaces can be saved from being used to separate and wire the capacitor, leading to higher integration of the ring oscillator 200.

The ring oscillator 200 may be configured to have one or plural inverting delay units (102, etc.) connected to be shaped like a ring. In the case of plural inverting delay units (102, etc.), if an odd number, rather than even number, of inverting delay units are provided, a start-up circuit or the like for causing an oscillating state is favorably not needed.

Furthermore, to simplify the circuit configuration of the ring oscillator 200, the bias circuit 180 that supplies bias signals is connected to all the inverting delay units 102, 103, 104. That is, the bias circuit 180 is shared by the inverting delay units 102, 103, 104. Note that the inverting delay units 102, 103, 104 each may be provided with a bias circuit 180.

For example, in the ring oscillator 200, when the input voltage signal VIN1 input to the input terminal IN1 of the first stage inverting delay units 102 is at the L level as an initial level, a first conductivity-type transistor Q12 becomes conductive and a second conductivity-type transistor Q15 becomes non-conductive. Also, the gate electrode of a first drive transistor Q3 is supplied with the bias signal Vb1, and the gate electrode of a second drive transistor Q19 is supplied with the bias signal Vb2. Thus, a first current path for a drive current Ib2 is formed through a source side transistor Q4, the first conductivity-type transistor Q12, and the second drive transistor Q19 between the source power line and the sink power line.

Here, the drive current Ib2 is copied into the transistor Q5 as its drain current and becomes a charging current Ib2' through an output terminal OUT1 to the capacitor C1. Thus, a charge-discharge waveform VOUT1 across the capacitor C1 becomes the delayed inverse in logic (the H level) of the input voltage signal VIN1. The delay time of the charge-discharge waveform VOUT1 in response to the input voltage signal VIN1 is controlled linearly according to the levels of the bias signals Vb1, Vb2, i.e., the level of the control signal V3 and the capacitance of the capacitor C1.

The inverting delay unit 103 at the next stage has the charge-discharge waveform VOUT1 being at the H level from the inverting delay unit 102 at the first stage inputted to its input terminal IN2. Thus, a first conductivity-type transistor Q13 becomes non-conductive and a second conductivity-type transistor Q16 becomes conductive. Also, the gate electrode of a first drive transistor Q6 is supplied with the bias signal Vb1, and the gate electrode of a second drive transistor Q22 is supplied with the bias signal Vb2. Thus, a second current path for a drive current Ib1 is formed through the first drive transistor Q6, the second conductivity-type transistor Q16, and the sink side transistor Q22 between the source power line and the sink power line.

Here, the drive current Ib1 is copied into the transistor Q24 as its drain current and becomes a discharging current Ib1' through the output terminal OUT2 from the capacitor C2. Thus, a charge-discharge waveform VOUT2 across the capacitor C2 becomes the delayed inverse in logic (the L level) of the charge-discharge waveform VOUT1 being at the H level. The delay time of the charge-discharge waveform VOUT2 in response to the charge-discharge waveform VOUT1 is controlled linearly according to the levels of the bias signals Vb1, Vb2, i.e., the level of the control signal V3 and the capacitance of the capacitor C2.

The inverting delay unit 104 at the last stage has the charge-discharge waveform VOUT2 being at the L level from the inverting delay unit 103 inputted to its input terminal IN3. Thus, a first conductivity-type transistor Q14 becomes conductive and a second conductivity-type transistor Q17 becomes non-conductive. Also, the gate electrode of a first drive transistor Q9 is supplied with the bias signal Vb1, and the gate electrode of a second drive transistor Q25 is supplied with the bias signal Vb2. Thus, a first current path for a drive current Ib2 is formed through a source side transistor Q10, the first conductivity-type transistor Q14, and the second drive transistor Q25 between the source power line and the sink power line.

Here, the drive current Ib2 is copied into the transistor Q11 as its drain current. Thus, an output voltage signal VOUT3 (an oscillation clock signal) being at the H level is fed back through an output terminal OUT3 to the input terminal IN1 of the inverting delay unit 102 at the first stage. In this way, the output voltage signal VOUT3 of the inverting delay unit 104 at the last stage of the ring oscillator 200 becomes the H level/the L level repeatedly, thus producing the oscillation clock signal.

Figure 6:
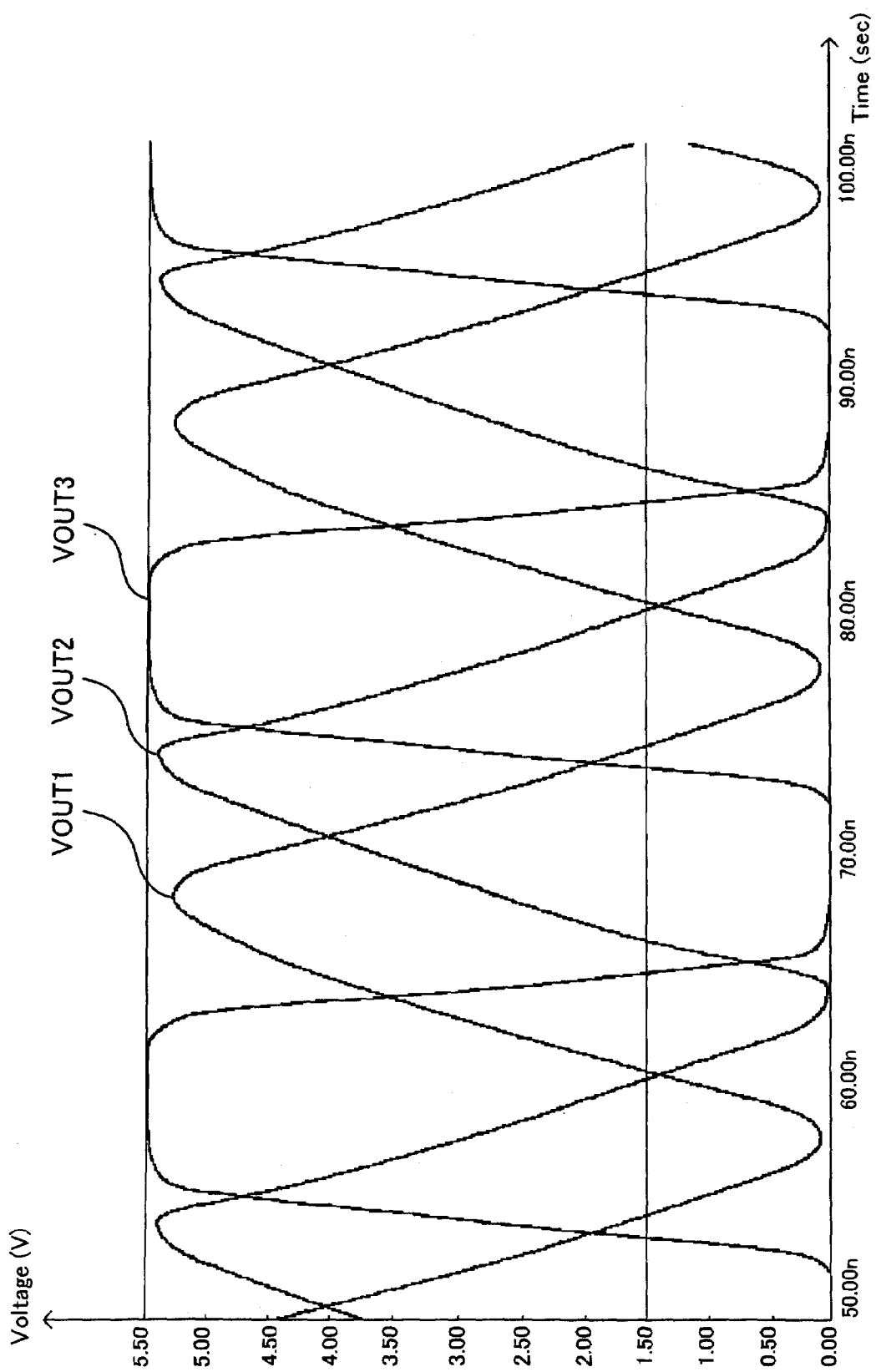
FIG. 6 shows simulation waveforms of the ring oscillator according to the implementation of the invention for when a control voltage is at 1.5 V.
Figure 7:
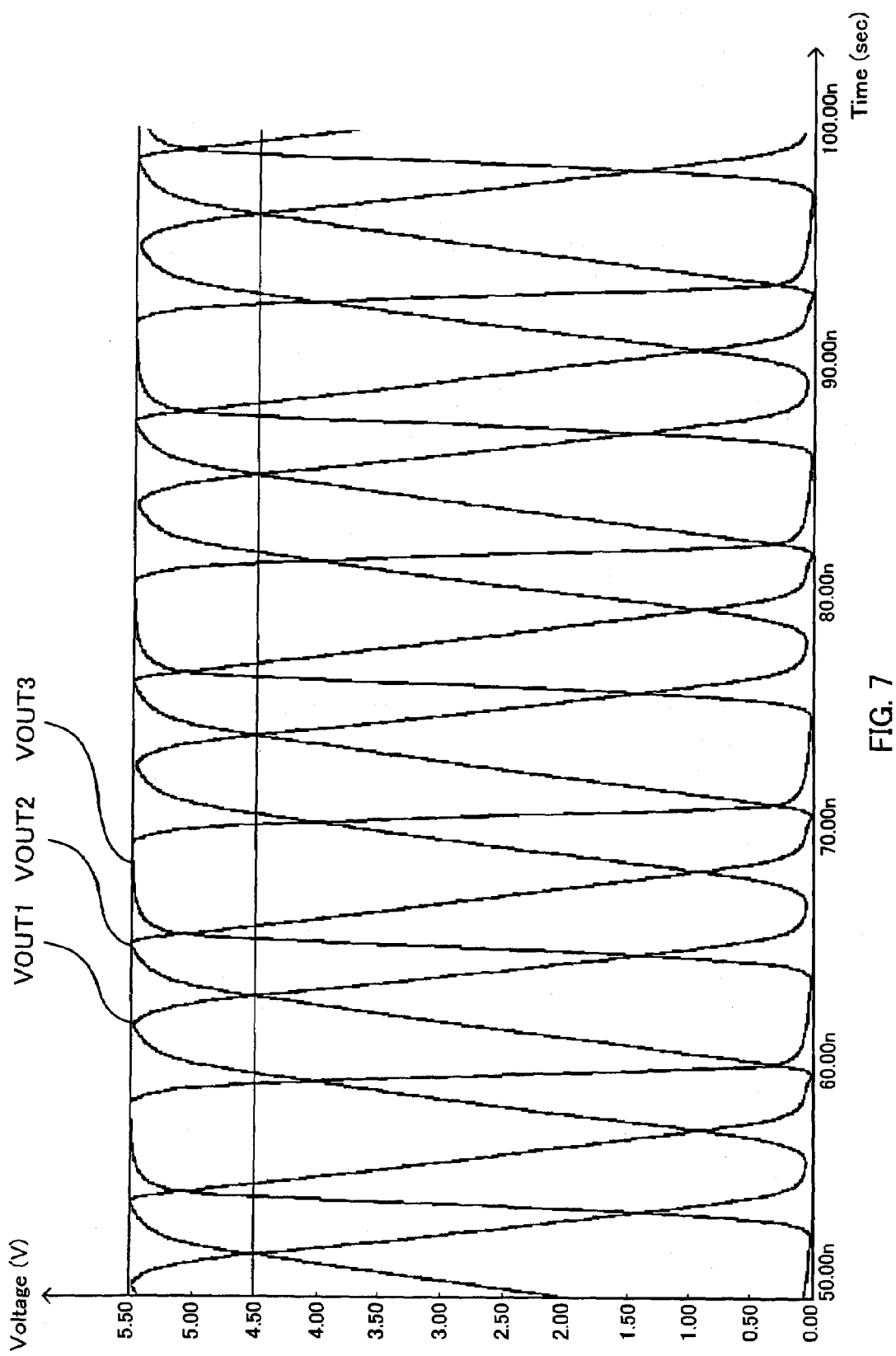
FIG. 7 shows simulation waveforms of the ring oscillator according to the implementation of the invention for when the control voltage is at 4.5 V.

FIGS. 6, 7 show simulation waveforms of main signals of the ring oscillator 200. FIG. 6 shows simulation waveforms of the output voltage signals VOUT1, VOUT2, VOUT3 of the ring oscillator 200 for when the control signal V3 of the bias circuit 180 is at 1.5 V. FIG. 7 shows simulation waveforms of the output voltage signals VOUT1, VOUT2, VOUT3 for when the control signal V3 of the bias circuit 180 is at 4.5 V.

Comparing the waveforms of FIGS. 6, 7, it is found that if the control signal V3 of the bias circuit 180 is low, rise and fall times of the output voltage signals VOUT1, VOUT2, VOUT3 are long, and thus the frequency of the oscillation clock signal becomes low. Conversely, if the control signal V3 of the bias circuit 180 is high, rise and fall times of the output voltage signals VOUT1, VOUT2, VOUT3 are short, and thus the frequency of the oscillation clock signal becomes high.

Figure 8:
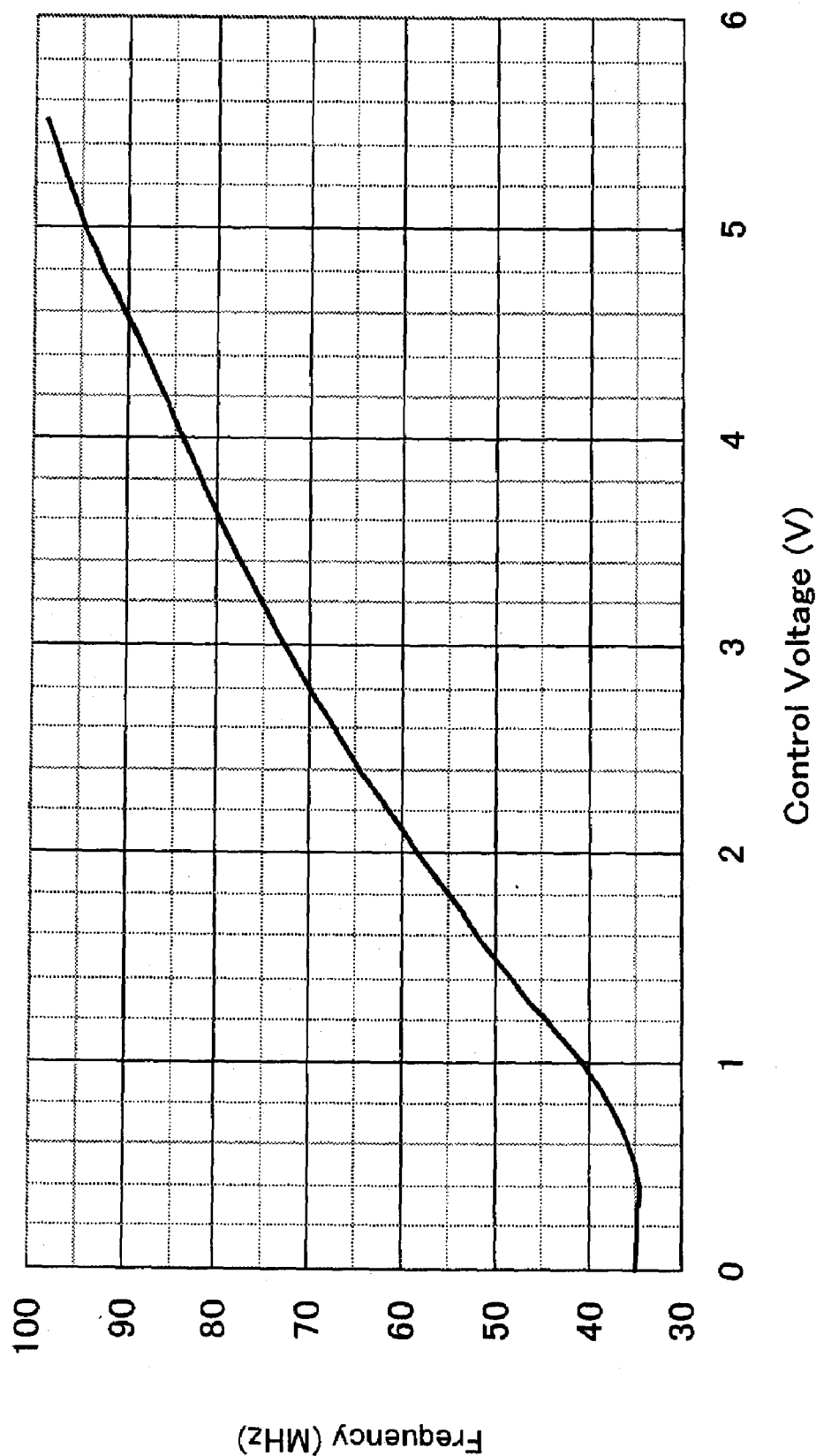
FIG. 8 shows the oscillation frequency characteristic against the control voltage of the ring oscillator according to the implementation of the invention.
Figure 9:
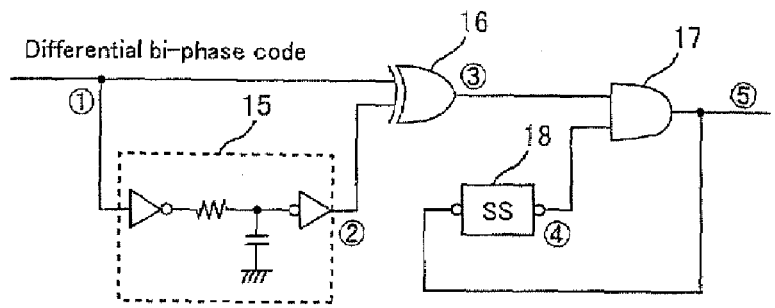
FIG. 9 is a diagram illustrating the configuration of a conventional clock extracting circuit for a differential bi-phase code format.
Figure 10:
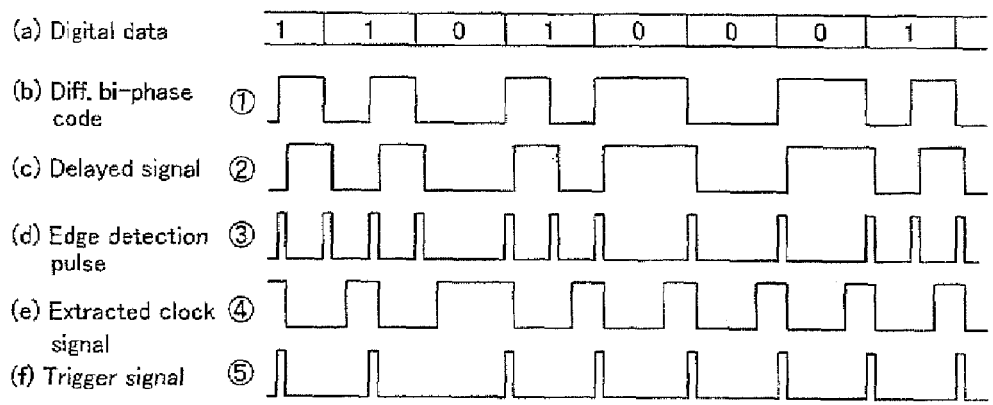
FIG. 10 is a timing chart showing the operation of the conventional clock extracting circuit for the differential bi-phase code format.

FIG. 8 shows the oscillation frequency characteristic of the ring oscillator 200 against the control signal V3 based on simulation results as shown in FIGS. 6, 7. As seen in FIG. 8, it is found that the ring oscillator 200 controls the oscillation frequency almost linearly according to the control signal V3.

Although the implementation of the present invention has been described, the above implementation is provided to facilitate the understanding of the present invention and not intended to limit the present invention. It should be understood that various changes and alterations can be made therein without departing from spirit and scope of the invention and that the present invention includes its equivalents.

What is claimed is:

1. A delay circuit for outputting an output signal produced by delaying an input signal according to a control signal for controlling a delay time, the delay circuit comprising:

an inverter that is formed in between a source power line and a sink power line by a first conductivity-type transistor (M6) on the source side and a second conductivity-type transistor (M7) on the sink side which complementarily become conductive according to a level of the input signal;

a source side current mirror that is formed by two source side transistors (M4, M5) provided between the source power line and the inverter, wherein their control electrodes are connected in common and one of the source side transistors (M4) is connected to form a diode and in series to the first conductivity-type transistor (M6);

a sink side current mirror that is formed by two sink side transistors (M10, M11) provided between the inverter and the sink power line, wherein their control electrodes are connected in common and one of the sink side transistors (M10) is connected to form a diode and in series to the second conductivity-type transistor (M7);

a bias circuit that generates two bias signals to drive the first conductivity-type transistor (M6) and the second conductivity-type transistor (M7) respectively according to the control signal;

a first drive transistor (M3) provided between the source power line and the second conductivity-type transistor (M7) that drives according to one of the bias signals; and a second drive transistor (M9) provided between the first conductivity-type transistor (M6) and the sink power line that drives according to the other of the bias signals, wherein the other of the source side transistors (M5) and the other of the sink side transistors (M11) are connected in series, wherein, when the first conductivity-type transistor (M6) becomes conductive on the basis of one level of the input signal, a first current path is formed through the one of the source side transistors (M4), the first conductivity-type transistor (M6), and the second drive transistor (M9) between the source power line and the sink power line, and the output signal being the delayed inverse of the one level of the input signal is output from a connection point of the other of the source side transistors (M5) and the other of the sink side transistors (M11), and wherein, when the second conductivity-type transistor (M7) becomes conductive on the basis of the other level of the input signal, a second current path is formed through the first drive transistor (M3), the second conductivity-type transistor (M7), and the one of the sink side transistors (M10) between the source power line and the sink power line, and the output signal being the delayed inverse of the other level of the input signal is output from the connection point of the other of the source side transistors (M5) and the other of the sink side transistors (M11).

2. The delay circuit according to claim 1, wherein the bias circuit has a current mirror circuit that produces the bias signals according to the control signal that is a current generated by a variable current source, and wherein the variable current source has a variable current generator that generates a variable current by a variable voltage being applied to a first resistor, and a fixed current generator that generates a fixed current by a power supply potential being applied to a second resistor, and the current generated is a combined current of the variable current and the fixed current.

3. The delay circuit according to claim 2, wherein the variable current generator and the fixed current generator each has a current mirror circuit wherein base electrodes of two bipolar transistors are connected to each other and one of the bipolar transistors is connected to form a diode.

4. The delay circuit according to claim 1, wherein a capacitor having a capacitance corresponding to given charge and discharge times is connected to the connection point of the other of the source side transistors (M5) and the other of the sink side transistors (M11).

5. The delay circuit according to claim 4, wherein the capacitor is charged/discharged in response to the input signal switching in level to produce a trapezoidal charge-discharge waveform.

6. A ring oscillator which has a plurality of the delay circuits according to claim 4 connected to be shaped like a ring, wherein at least one of the respective capacitors of the plurality of delay circuits is removed and the capacitance of the at least one is combined into the capacitances of the other capacitors.

7. A ring oscillator which has a plurality of the delay circuits according to claim 1 connected to be shaped like a ring.

8. The ring oscillator according to claim 7, which has an odd number of the delay circuits connected to be shaped like a ring.

9. The ring oscillator according to claim 7, wherein the plurality of delay circuits share a bias circuit with their respective bias circuits being removed.

* * * * *